United States Patent
Li

(10) Patent No.: US 8,052,432 B1
(45) Date of Patent: Nov. 8, 2011

(54) CIRCUIT BOARD STRUCTURE FOR CIRCUIT BOARD MODULE

(75) Inventor: Lei Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/911,845

(22) Filed: Oct. 26, 2010

(30) Foreign Application Priority Data

Sep. 21, 2010 (CN) .......................... 2010 1 0289194

(51) Int. Cl.
*H01R 12/00* (2006.01)
*H05K 1/00* (2006.01)
(52) U.S. Cl. ........................................................ 439/79

(58) Field of Classification Search ................ 439/79, 439/55, 676
See application file for complete search history.

(56) References Cited

U.S. PATENT DOCUMENTS 4,721,473 A * 1/1988 DelGuidice et al. ............ 439/79
7,621,784 B2 * 11/2009 Ichimiya et al. .............. 439/676
* cited by examiner

*Primary Examiner* — Javaid Nasri
(74) *Attorney, Agent, or Firm* — Altis Law Group, Inc.

(57) ABSTRACT

A circuit board structure used to assemble a connector includes a circuit board and a jack for assembling the connector. The jack includes a base board and a number of latching members. The latching members latch the base board to the circuit board. Each latching member includes a main portion and at least one bent portion. The main portion resisting the circuit board. The bent portion holds the base board toward the circuit board.

9 Claims, 5 Drawing Sheets

CIRCUIT BOARD STRUCTURE FOR CIRCUIT BOARD MODULE

BACKGROUND

1. Technical Field

The disclosure generally relates to circuit board structures, particularly to a circuit board structure having a jack for assembling a networking connector.

2. Description of Related Art

During the testing for communication performance of a motherboard of a server, a networking connector such as a RJ-45 connector is usually mounted thereon for connecting the motherboard to a network. The motherboard defines a number of pin holes. The pins of the networking connector are received and soldered in the pin holes. However, the motherboard may be easily damaged during soldering. In addition, it is difficult to disassemble the soldered networking connector from the motherboard after testing.

Therefore, there is room for improvement within the art.

BRIEF DESCRIPTION OF THE DRAWINGS

Many aspects of the circuit board structure for circuit board module can be better understood with reference to the following drawings. The components in the drawings are not necessarily drawn to scale, the emphasis instead being placed upon clearly illustrating the principles of the circuit board structure for circuit board.

DETAILED DESCRIPTION

Figure 1:
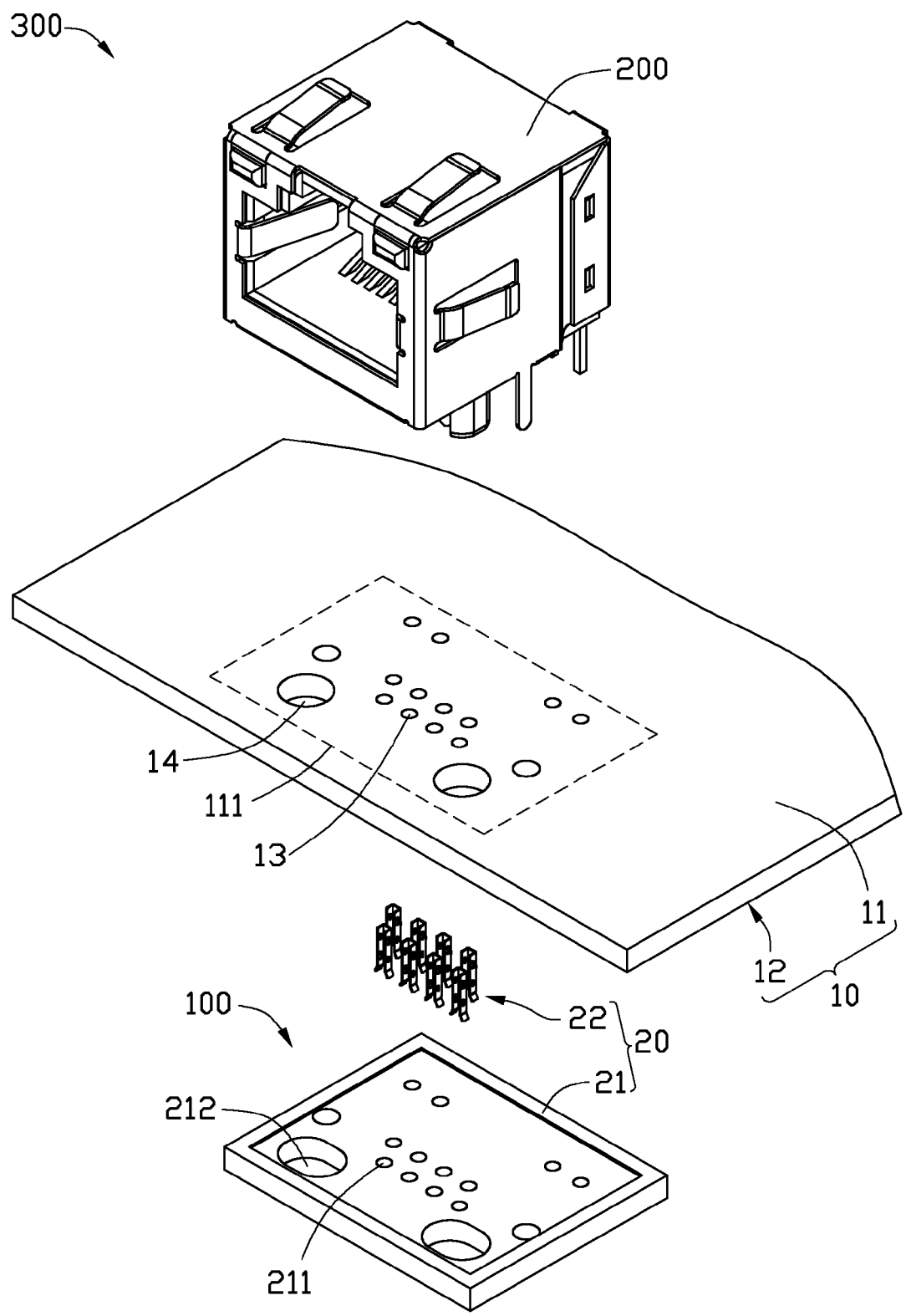
FIG. 1 is a disassembled view of a circuit board module employed with a circuit board structure, according to an exemplary embodiment.

FIG. 1 shows a circuit board module 300, according to an exemplary embodiment. The circuit board module 300 includes a circuit board structure 100 and a connector 200 that can be conveniently assembled or disassembled from the circuit structure 100.

Figure 2:
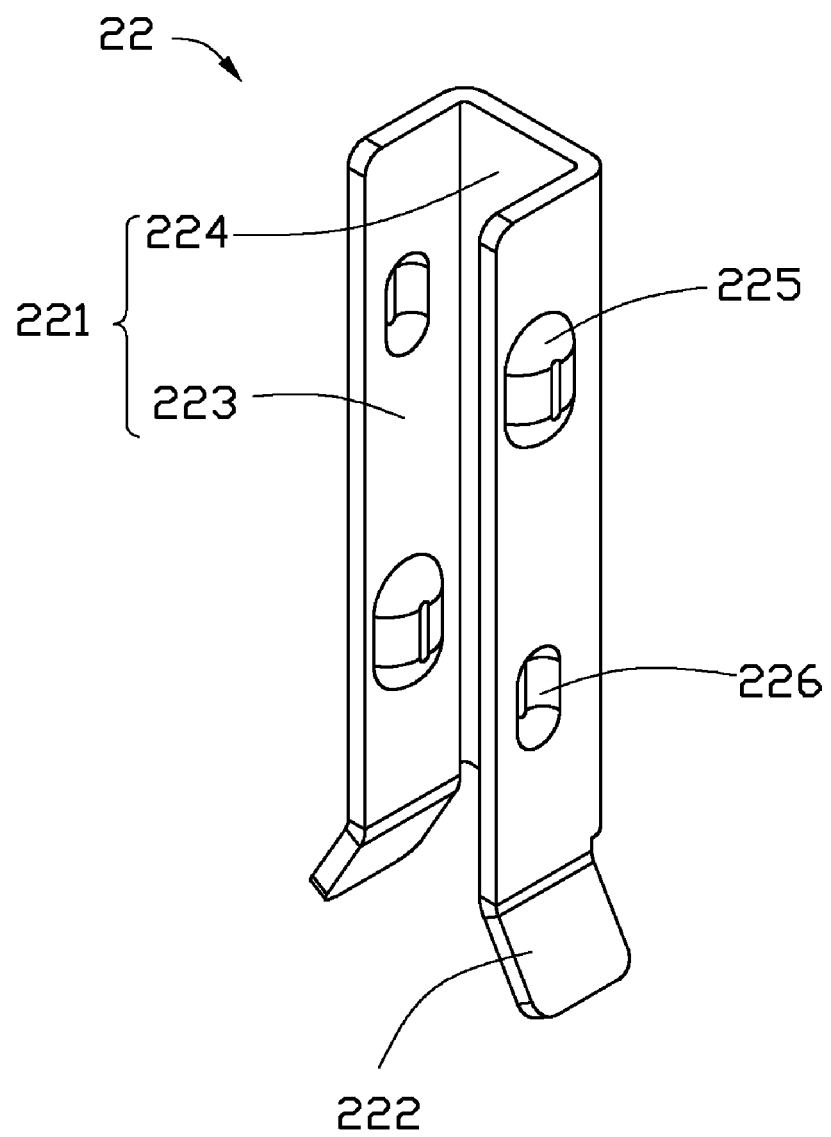
FIG. 2 is an enlarged schematic view of a latching member of the circuit board structure shown in FIG. 1.
Figure 3:
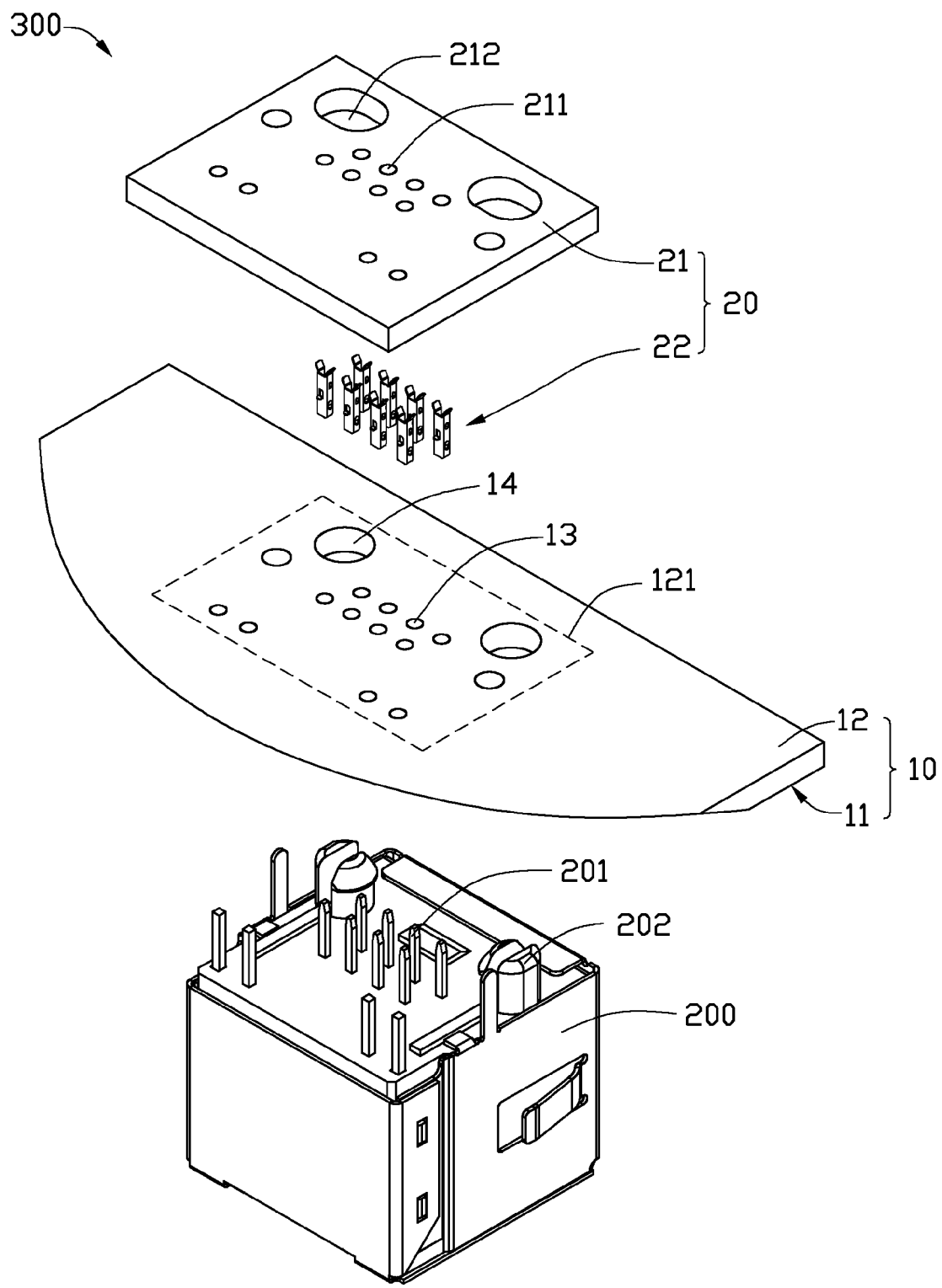
FIG. 3 is similar to FIG. 1, but shown from another aspect.

Referring to FIGS. 1, 2 and 3, the circuit board structure 100 includes a circuit board 10, and a jack 20 mounted on the circuit board 10. The connector 200 can be assembled to the circuit board 10 with the jack 20. In this embodiment, the connector 200 is a networking connector, such as a RJ-45 connector. The connector 200 includes a plurality of pins 201 and positioning posts 202 protruding from one side.

The circuit board 10 can be a mother board of a server. The circuit board 10 includes a first surface 11 and an opposite second surface 12. The first surface 11 includes a first mounting area 111 for mounting the connector 200. A plurality of pin holes 13 and positioning holes 14 are defined in the first mounting area 111. The pin holes 13 and the positioning holes 14 respectively correspond to the pins 201 and the positioning posts 202. When the connector 200 is assembled to the first mounting area 11, the pins 201 and the positioning posts 202 are respectively received in the pin holes 13 and the positioning posts 202. The second surface 12 includes a second mounting area 121 opposite to the first mounting area 111 to mount the jack 20.

Further referring to FIG. 2, the jack 20 includes a base board 21 and a plurality of latching members 22. A plurality of through holes 211 and mounting holes 212 are defined in the base board 21. The through holes 211 and mounting holes 212 respectively correspond to the pin holes 13 and the positioning hole 14.

The number of the latching members 22 matches to the number of pin holes 13. Each latching member 22 includes a main portion 221 and two bent portions 222.

The main portion 221 is U-shaped and includes two opposite side walls 223 and a bottom wall 224 connecting the two side walls 223. Each bent portion 222 is a sheet bent from one end of each side wall 223. Each side wall 223 includes a first protrusion 225 and a second protrusion 226. The first and second protrusions 225 and 226 are positioned at two opposite sides of the side wall 223. Wherein, the first protrusion 225 protrudes from an outer surface of the side wall 223; the second protrusion 226 protrudes from an inner surface of the side wall 223. The first and second protrusion 225 and 226 can be flexible.

Figure 4:
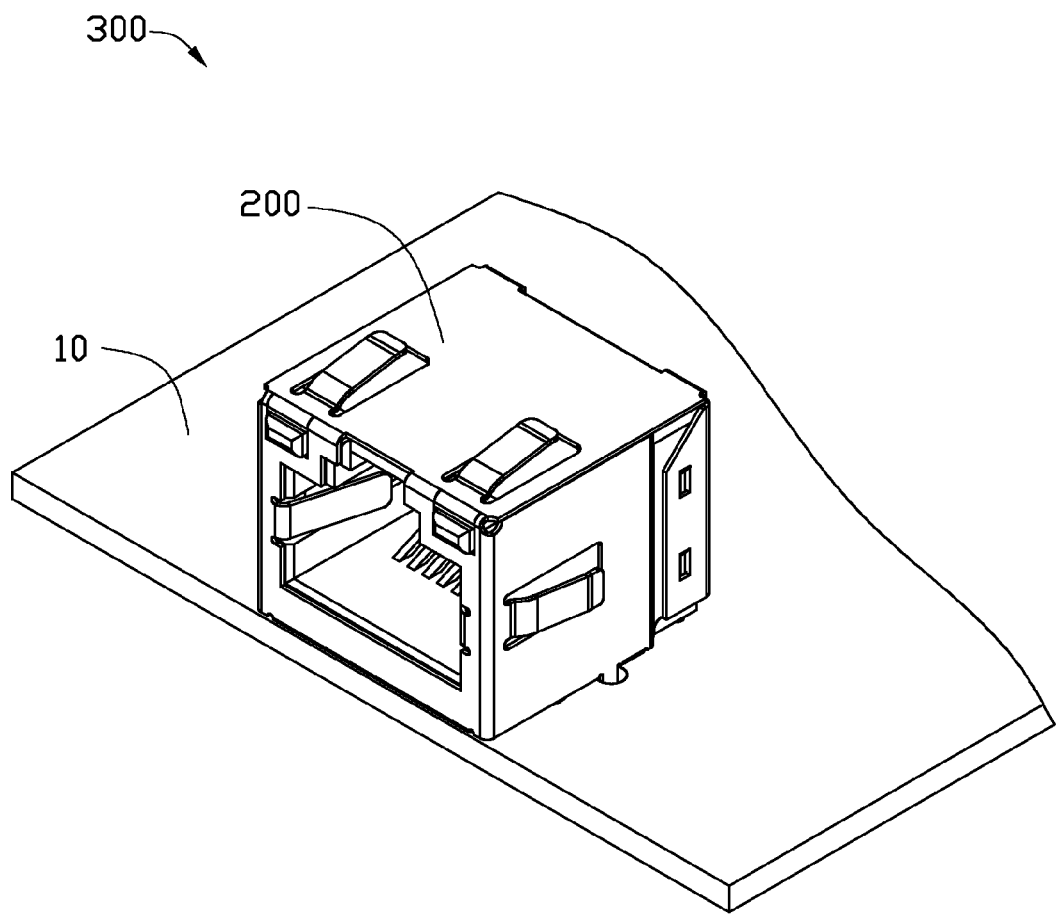
FIG. 4 is an assembled view of the circuit board module of FIG. 1.
Figure 5:
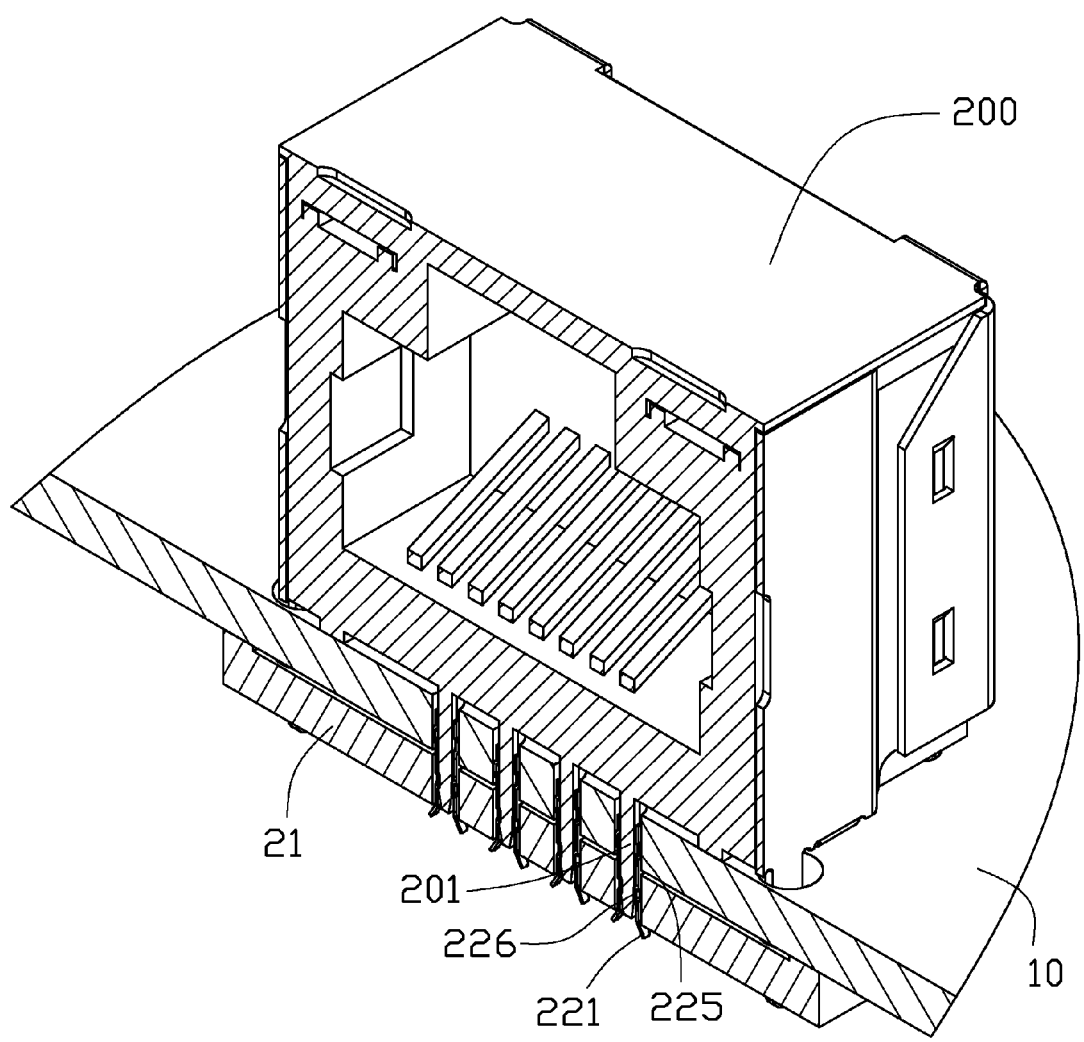
FIG. 5 is a cross-section view of the circuit board module of FIG. 4.

Referring to FIGS. 4 and 5, to assemble the circuit board structure 100, the base board 21 is positioned at the second mounting area 121. The through holes 211 and the mounting holes 212 are respectively aligned to the pin holes 13 and the positioning holes 14. Each latching member 22 is assembled into the corresponding pin hole 13 with the mounting holes 212. The main portion 221 of each latching member 22 is extended through the pin hole 13 from the through holes 211 until the bent portions 222 abut against the base board 21 and hold the base board 21 toward the circuit board 10. Meanwhile, the two first protrusions 225 of each latching member 22 resist at the circuit board 10 in the corresponding pin holes 13. Therefore, the base board 21 is latched to the circuit board 10 by the latching members 22.

To assemble the connector 200 to the circuit board structure 100, the pins 201 and the positioning post 202 are respectively received in the corresponding pin holes 13 and positioning holes 14 from the through holes 211 and the mounting holes 212. The two second protrusions 226 of each latching member 22 are resisted at the pin 13 received therein. Thus, the connector 200 is assembled to the circuit board structure 100. Moreover, the pins 13 received in the pin holes 13 also are resisted at the latching member 22, which makes the assembly between the latching member 22 and the circuit board 10 more stable.

The connector 200 can be assembled to or disassembled from the circuit board 10 by the jack 20 without soldering, which is convenient and also safe for circuit board 10.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A circuit board structure used to assemble a connector; comprising:
   a circuit board defining a plurality of pin holes; and
   a jack for assembling the connector to the circuit board, the jack including:
      a base board defining a plurality of through holes corresponding to the pin holes; and
      a plurality of latching members latching the base board to the circuit board; wherein each latching member includes a main portion and at least a bent portion holding the base board toward the circuit board, the main portion includes two opposite side walls and a bottom wall connecting the two side walls; each side wall includes a first protrusion protruding from an outer surface thereof and a second protrusion protruding from an inner surface thereof; the main portion extends through the corresponding pin hole, the two first protrusion of each latching member resists the circuit board; the connector includes a plurality of pins, the pins are received in the pin holes from the through holes and resisting the second protrusion.

2. The circuit board structure as claimed in claim 1, wherein the bent portion is a sheet bent from one end of the side wall.

3. The circuit board structure as claimed in claim 1, wherein the first protrusions are flexible.

4. The circuit board structure as claimed in claim 1, wherein the second protrusions are flexible.

5. A circuit board module, comprising:
a circuit board structure, comprising:
a circuit board defining a plurality of pin holes;
a jack including a base board defining a plurality of through holes corresponding to the pin holes; and a plurality of latching members latching the base board to the circuit board; and
a connector detachablely assembled to the circuit board by the jack;
wherein each latching member includes a main portion resisting the circuit board and at least a bent portion holds the base board toward the circuit board; the main portion includes two opposite side walls and a bottom wall connecting the two side walls; each side wall includes a first protrusion protruding from an outer surface thereof and a second protrusion protruding from an inner surface thereof; the main portion extends through the corresponding pin hole, the two first protrusion of each latching member resists the circuit board; the connector includes a plurality of pins, the pins are received in the pin holes from the through holes and resisting the second protrusion.

6. The circuit board module as claimed in claim 5, wherein the bent portion is a sheet bent from one end of the side wall.

7. The circuit board module as claimed in claim 5, wherein the first protrusions are flexible.

8. The circuit board module as claimed in claim 5, wherein the second protrusions are flexible.

9. The circuit board module as claimed in claim 5, wherein the connector is an RJ-45 connector.

* * * * *